(12) United States Patent
Li

(10) Patent No.: US 8,465,802 B2
(45) Date of Patent: Jun. 18, 2013

(54) CHEMICAL VAPOR DEPOSITION REACTOR AND METHOD

(76) Inventor: Gang Li, Shanghai (CN)

( * ) Notice: Subject to any disclaimer, the term of this patent is extended or adjusted under 35 U.S.C. 154(b) by 888 days.

(21) Appl. No.: 12/494,260

(22) Filed: Jun. 29, 2009

(65) Prior Publication Data

US 2010/0047450 A1 Feb. 25, 2010

Related U.S. Application Data

(60) Provisional application No. 61/081,448, filed on Jul. 17, 2008.

(51) Int. Cl.
*C23C 16/458* (2006.01)

(52) U.S. Cl.
USPC .................. 427/255.28; 118/728; 118/733

(58) Field of Classification Search
USPC ............... 118/715, 728, 733; 427/255.28, 427/248.1
See application file for complete search history.

(56) References Cited

U.S. PATENT DOCUMENTS

| | | | |
|---|---|---|---|
| 4,526,805 A | * | 7/1985 | Yoshizawa ................ 427/563 |
| 6,089,183 A | | 7/2000 | Imai et al. |
| 6,220,202 B1 | | 4/2001 | Foster et al. |
| 2006/0133972 A1 | | 6/2006 | Guetlhuber et al. |
| 2008/0110400 A1 | | 5/2008 | Satou et al. |

FOREIGN PATENT DOCUMENTS

| | | |
|---|---|---|
| JP | 7-277387 | * 10/1995 |
| JP | 2000150195 | 5/2000 |

* cited by examiner

*Primary Examiner* — Mathieu D. Vargot
(74) *Attorney, Agent, or Firm* — Michael Molins

(57) ABSTRACT

A reactor and method for performing chemical vapor deposition are disclosed. A chemical vapor deposition reactor can have a cylindrical chamber that comprises a cylindrical lid support and an annular gas distribution plate. Said chamber can be configured to have a horizontal laminar flow of at least one gas stream in the radial direction and a vertical downward flow of another gas stream over wafers. A large capacity of a CVD reactor with simple structures, easy maintenance and low consumption of reactants can be achieved. High uniformity, repeatability, reproducibility and consistency of depositing layers on wafers can be obtained.

13 Claims, 10 Drawing Sheets

CHEMICAL VAPOR DEPOSITION REACTOR AND METHOD

TECHNICAL FIELD OF INVENTION

The present invention relates generally to a reactor and method for performing chemical vapor deposition (CVD).

The invention has been developed primarily for use as a CVD reactor having a cylindrical chamber for deposition of crystalline layers on one or more likewise crystalline substrates and will be described hereinafter with reference to this application. However, it will be appreciated that the invention is not limited to this particular field of use.

BACKGROUND

Any discussion of the prior art throughout the specification should in no way be considered as an admission that such prior art is widely known or forms part of the common general knowledge in the field.

In general, the gas flow dynamics for high quality layers deposited by CVD favors laminar flow Laminar flow, as oppose to convective flow, is required to achieve high efficiency of CVD processes and high uniformity of deposited layers.

Referring now to FIG. 1, one type of contemporary reactor is commonly referred to as planetary reactor. The reactor comprises a cylindrical chamber 122 within which chemical vapor deposition is performed, a quartz plate 104 attached to a lid 101 with a gas cooled spacer 120, a centric gas inlet nozzle 107, a rotating susceptor 106 holding a plurality of rotating satellites 127, a heat assembly 126 underneath the susceptor 106, and a gas collect ring 103 surrounding the periphery of the susceptor 106.

Gases enter the cylindrical chamber 122 via the centric inlet nozzle 107 that separates one mixture of gases, such as Group III reactants, from the other, i.e. Group V reactants, prior to their introduction into the cylindrical chamber 122. The centric inlet nozzle 107 and the exhaust 103 are above the susceptor 106. The reactant gases flow in the outwardly radial direction from the centric inlet nozzle 107 to the gas collect ring 103.

As the reactants in carrier gases proceed from the center toward the periphery, a substantial amount of the reactants is consumed along the way due to parasitic reactions forming particles and/or adducts in the gas phase, so as to be called as the depletion effect. As a result, the depositing rate falls along the flow direction. For an outwardly radial flow of reactant gases, the mass density of reactants in the gas phase decreases due to gradually increased cross-section, which forms another inherent source of non-uniform deposition in such a cylindrical chamber.

One contemporary approach to mitigate the depletion effect is to use a high gas flow rate to reduce the concentration gradient along the flow direction, but the drawback of this approach is an inherent decrease in efficiency of CVD processes and an increased consumption of reactant gases. Another contemporary approach to mitigate the depletion effect caused non-uniformity is rotating wafers and/or satellites. Referring to FIG. 1, the susceptor 106 rotates at approximately 10 rpm and the satellites 127 rotate at approximately 50 rpm. Making such kinds of the susceptor capable of rotating multiple wafers and/or satellites in a sealed chamber under very dynamic CVD conditions is inherently expensive and complicated, which has impeded a further increase of the wafer capacity of the planetary reactor.

Furthermore, referring to FIG. 1, due to lack of active gases flowing through, heavy deposits are inherently accumulated on the down surface of the quartz plate 104, which not only depletes the reactants but also deteriorates CVD processing. In order to precisely assembly the components, such as the nozzle 107 and the quartz plate 104 together to the lid 101, the structure of the lid 101 is inherently complex. It is inherently difficult to maintain or clean the lid 101 in routine operation. As a result, repeatability, reproducibility and consistency of the CVD processes can not be ensured. Deformation of the lid 101 under low pressures also influences CVD processing and further impedes the scale up of the cylindrical chamber size in diameter.

Referring to FIG. 2, another type of contemporary reactor is commonly referred to as turbo-disc reactor. The reactor comprises a cylindrical chamber 222, a flow flange 204 where all the reactant gases are distributed and delivered vertically into the cylindrical chamber 222, a wafer carrier 206 spinning at speeds between 500 and 1500 rpm, a heater assembly 226 underneath the wafer carrier 206 configured to heat wafers 200 to desired process temperatures, and an exhaust 203 at the bottom side of the cylindrical chamber 222. The wafer carrier 206 comprises a plurality of pockets, each of which is configured to contain a wafer 200.

In such a reactor, the longitudinal depletion effect of reactants in the flow direction and the effect of lid deposition on CVD processes are substantially mitigated. A few inlets respectively for introduction of reactants require a minimum chamber height for a uniform mixture of reactants above the surface of the wafer carrier 206. An enlarged diameter of a chamber needs an increased height of the cylindrical chamber. Particularly at high pressures and temperatures, thermal convection occurs severely in a large volume of chamber. The gas flow tends to be undesirably turbulent. In order to suppress thermal convection, a high gas flow may be applied and the wafer carrier 206 may spin at very high speeds. One of the drawbacks is an increased consumption of reactants, and the other is that to spin a large wafer carrier at a very high speed substantially without wobbling is inherently extremely difficult. Deformation of the lid 201 under low pressures may influence CVD processing and further impedes the scale up of the cylindrical chamber size in diameter.

Referring to FIG. 3, another type of contemporary reactor is commonly referred to as close coupled showerhead reactor. The reactor comprises a cylindrical chamber 322, a showerhead 304 through where all the reactant gases are distributed and delivered into chamber 322, a wafer carrier 306 rotating at speeds between 5 and 100 rpm, a heater assembly 326 underneath the rotating wafer carrier 306 configured to heat wafers 300 to desired process temperatures, and an exhaust 303 at the bottom side of the cylindrical chamber 322. The wafer carrier 306 comprises a plurality of pockets, each of which is configured to contain a wafer 300.

In such a reactor, thousands of separate fine orifices with complex water passages formed in the showerhead 304 can deliver and distribute gases uniformly over entire wafer carrier 306. The cylindrical chamber height can be substantially reduced to suppress buoyancy as well as parasitic reactions. However, the showerhead 304 is inherently complicated and expensive. Complex water passages around fine orifices face a great risk of leaks. Furthermore, a short distance from the showerhead 304 to the wafer carrier 306 inherently causes heavy deposits on the surface of the showerhead 304. The presence of thousands of separate fine orifices prevents easy and reproducible cleaning after CVD processing. As a result, repeatability, reproducibility and consistency of the CVD processes can not be ensured. Deformation of the lid 301 under low pressures also influences CVD processing and further impedes the scale up of the cylindrical chamber size in diameter.

Referring to FIG. 4, another type of reactor is commonly referred to as rectangular reactor. The reactor may comprise a rectangular chamber 422, the first gas inlet 407 disposed at one side of the cylindrical chamber 422 for a horizontal flow of gases, the second gas inlet 404 located at the top of the cylindrical chamber 422 for a vertical flow of gases, a susceptor 406, a heater 426 beneath the susceptor 406, and an exhaust 403 disposed at the other side of the cylindrical chamber 422.

A horizontal gas stream flows from the first gas inlet 407 to the exhaust 403 parallel to the surface of the susceptor 406. A vertical gas stream flows downwardly to suppress thermal convection for a laminar flow of the horizontal gas stream. Two gas streams mix in the vicinity of the wafers 400, which reduces parasitic reactions in the gas phase. However, the horizontal gas stream still suffers undesired longitudinal depletion effect. The rotation of wafers 400 may be used to compensate the depletion effect. For this type of a non-cylindrical chamber, the side-wall effect on flowing pattern perpendicular to the horizontal gas flow direction can deteriorate uniformity of depositing layers and reduce efficiency of CVD processes, which inherently prevents to build up a large size chamber.

Moreover, throughput requirements from production reactors have become important. The contemporary approach to increase throughput is typically to build larger chambers. Referring to the aforementioned reactors, the top plates of cylindrical chambers are not supported in the center and the gases are introduced through gas inlet devices disposed in the top plate. The thermal and mechanical stress may consequently tend to break top plates prematurely at great costs. So, the aforementioned reactors suffer from inherent deficiencies that tend to detract from their overall utility and desirability.

OBJECT OF THE INVENTION

It is an object of the present invention to overcome or ameliorate at least one of the disadvantages of the prior art, or to provide a useful alternative.

It is an object of the invention in a preferred form to provide a CVD reactor which eliminates the disadvantages of the abovementioned conventional chemical vapor deposition reactors.

It is another object of the invention in a preferred form to provide to provide a CVD reactor which can easily and economically be scaled up so as to increase throughput and reduce the costs of ownership.

It is another yet object of the invention in a preferred form to provide to provide a CVD reactor which deposit layers on substrates with good repeatability, reproducibility, controllability and uniformity.

It is another yet object of the invention in a preferred form to provide to provide a CVD reactor which is not substantially susceptible to undesirable depletion effect in the gas flow direction, undesirable thermal convection and undesirable parasitic reactions in the gas phase, so as to provide improved uniformity and enhanced efficiency of CVD processes.

SUMMARY OF THE INVENTION

According to an aspect of the invention there is provided a reactor apparatus for chemical vapor deposition, the apparatus comprising:

a reactor body defining a reaction chamber;

a close element for operatively (or substantially) sealing the reaction chamber;

a support element located within the reaction chamber for supporting the close element, the support element being supportedly coupled to the reactor body.

Preferably, the reactor body defines a substantially cylindrical reaction chamber. More preferably, the support element substantially centrally-axially located within the reaction chamber. Most preferably, the close element is substantially circular.

Preferably, the reactor body has a bottom plate, and the support element is substantially concentrically coupled to the bottom plate. More preferably, the support element defines an abutment surface for abutting support of the close element.

Preferably, the apparatus further comprises a wafer carrier substantially horizontally disposed within the reaction chamber for providing a substantially horizontally wafer reaction surface. More preferably, the wafer carrier is an annular wafer carrier concentrically located and vertically supported within the chamber; the annular wafer carrier substantially encircling the support element. Most preferably, the wafer carrier has an circumferential inner wall encircling and displaced from the support element for defining a gas discharge passage therebetween.

Preferably, the apparatus further comprises a gas inlet ring located about the periphery of the chamber. More preferably, the gas inlet ring includes a plurality of vertically-spaced annular gas injectors, each annular gas injector is connected to a separate gas supply manifold.

Preferably, the apparatus further comprises a gas egress passage proximal the support element. More preferably, the gas egress passage is defined by a gas discharge ring horizontally disposed about the support element.

According to an aspect of the invention there is provided a CVD reactor having a cylindrical chamber for deposition of in particular crystalline layers on one or more in particular likewise crystalline substrates. The chamber comprises a cylindrical lid support and an annular gas distribution plate, which mitigates complexities and costs of building a large size chamber, and said chamber can be configured to have a horizontal laminar flow of at least one stream in the radial direction and a vertical downward flow of another gas stream over wafers to provide repeatability, reproducibility and consistency of chemical vapor deposition processes and to achieve uniformity of deposited layers at reduced consumption of reactants.

According to one embodiment, a CVD reactor generally comprises a cylindrical chamber which further comprises a cylindrical lid support concentrically disposed in the center of a cylindrical chamber. The cylindrical lid support can have an upper ridge whereon the central portion of a lid can rest. Deformation of the lid centrally supported by the cylindrical lid support can be substantially prevented under low pressures, which inherently mitigates complexities and costs of construction.

According to another embodiment, a CVD reactor generally comprises a cylindrical chamber which can be configured to have a horizontally disposed annular gas distribution plate. The annular gas distribution plate bends a horizontal gas flow to a vertical gas flow downwardly to the surface of an annular wafer carrier, which not only mitigates complexities and costs of construction but also provides a vertical gas flow which can suppress thermal convection above heated wafers to reduce parasitic reactions in the gas phase and to maintain another horizontally injected gas flow in parallel or obliquely to the annular wafer carrier in contact with the surface of the annular wafer carrier. Moreover, an active vertical gas flow can effectively prevent deposits of reactants on the down surface of the annular gas distribution plate.

According to another yet embodiment, a CVD reactor generally comprises a cylindrical chamber which can be further configured for an inwardly radial flow of gases above the surface of an annular wafer carrier. When gases passage horizontally into and out of the cylindrical chamber at the periphery and the center, the reactant gases still suffer the depletion effect. On the other hand, the gas flow velocity increases due to radially converging geometry and the mass density of reactants increases due to concomitant converging reactant gases. The increased gas velocity can reduce the boundary layer thickness, which consequently increases the mass transport of reactants from the gas phase to the surface of a wafer. Therefore, the radially converging gas flow can inherently compensate the depletion effect to provide uniform deposition, which substantially mitigates complexities and costs of construction particularly related to wafer carriers and/or susceptor.

Additional objects and advantages of the invention will be set forth in the description which follows, and in part will be obvious from the description, or may be learned by practice of the invention. This invention will be more fully understood in conjunction with the following detailed description taken together with the following drawings.

BRIEF DESCRIPTION OF THE DRAWINGS

A preferred embodiment of the invention will now be described, by way of example only, with reference to the accompanying drawings in which.

DETAILED DESCRIPTION OF THE PREFERRED EMBODIMENTS

The invention and its various embodiments can now be better understood by turning to the following detailed description of the preferred embodiments which are presented as illustrated examples of the invention defined in the claims. It is expressly understood that the invention as defined by the claims may be broader than the illustrated embodiments described below.

Many alterations and modifications may be made by those having ordinary skill in the art without departing from the spirit and scope of the invention. Therefore, it must be understood that the illustrated embodiment has been set forth only for the purposes of example and that it should not be taken as limiting the invention as defined by the following claims.

Figure 1:
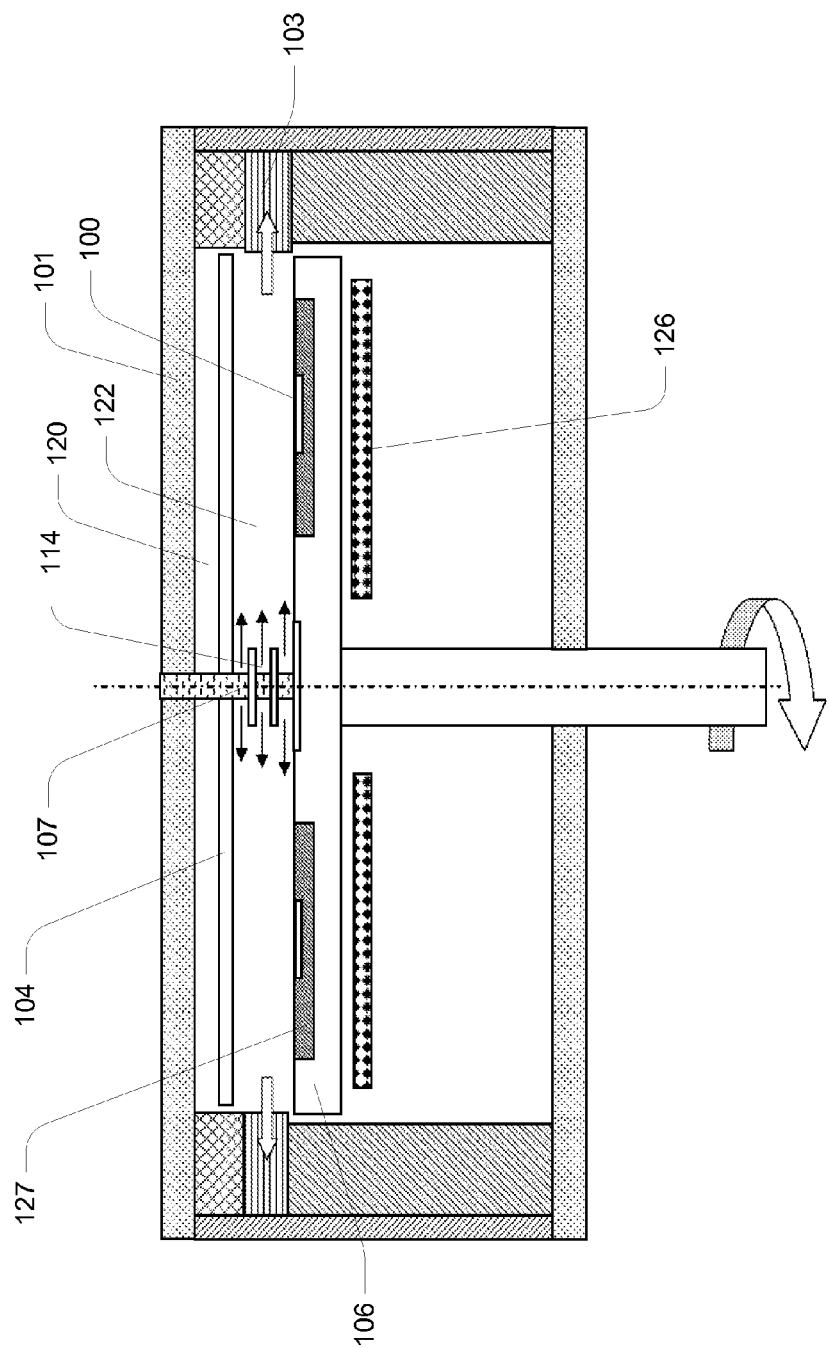
FIG. 1 is a sectional side view of a contemporary planetary chemical vapor deposition (CVD) reactor chamber.
Figure 2:
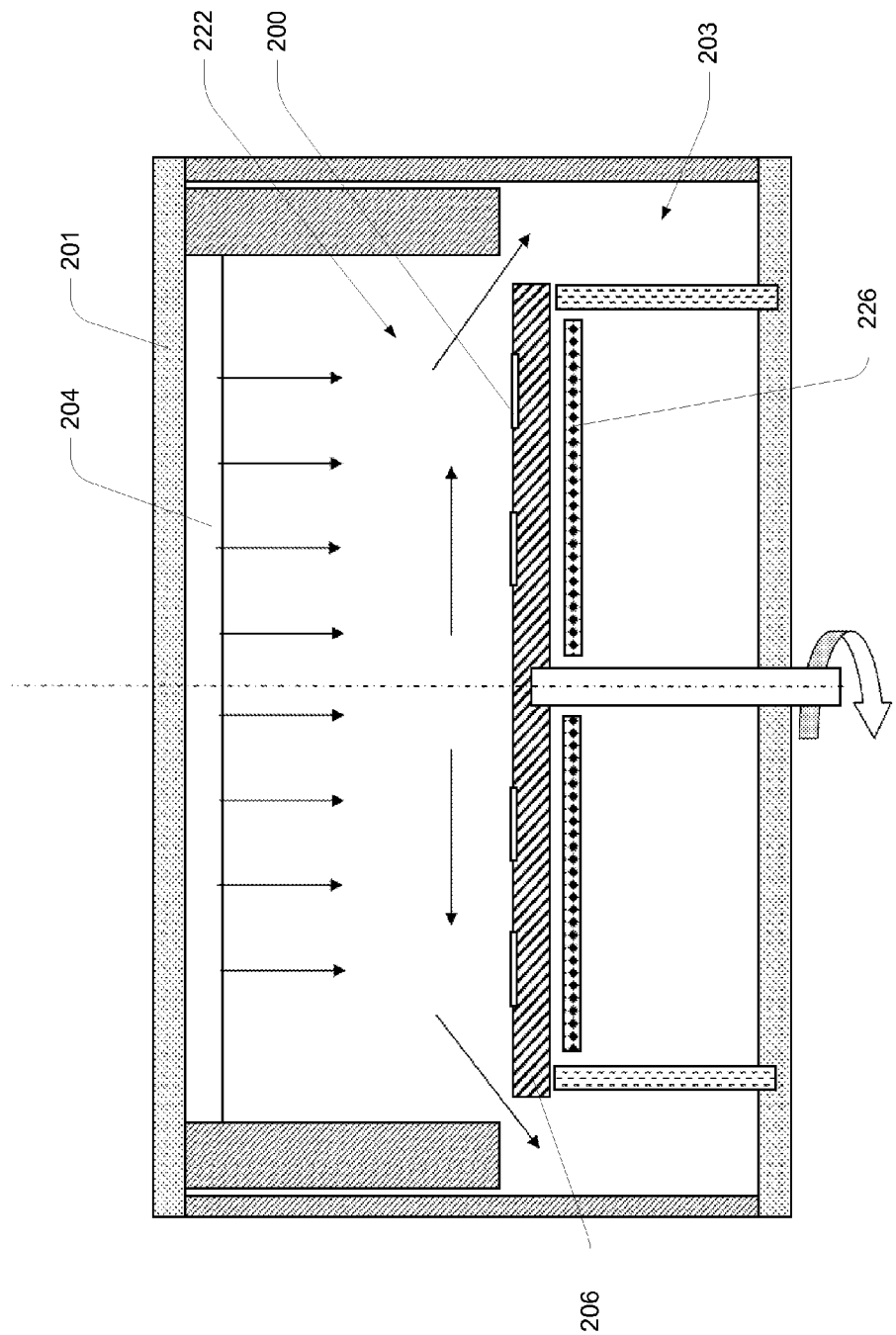
FIG. 2 is a sectional side view of a contemporary turbo-disc CVD reactor chamber.
Figure 3:
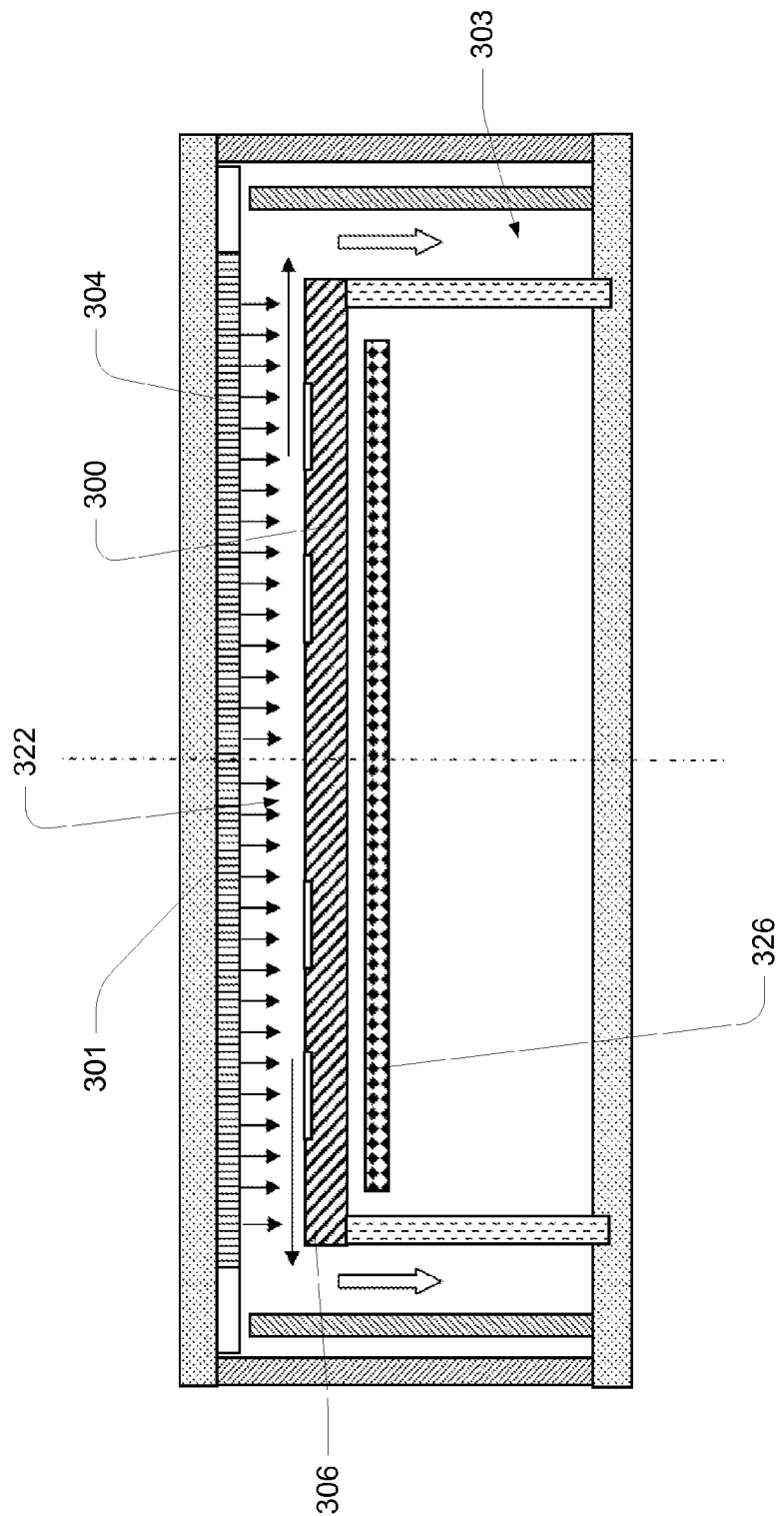
FIG. 3 is a sectional side view of a contemporary close coupled showerhead CVD reactor chamber.
Figure 4:
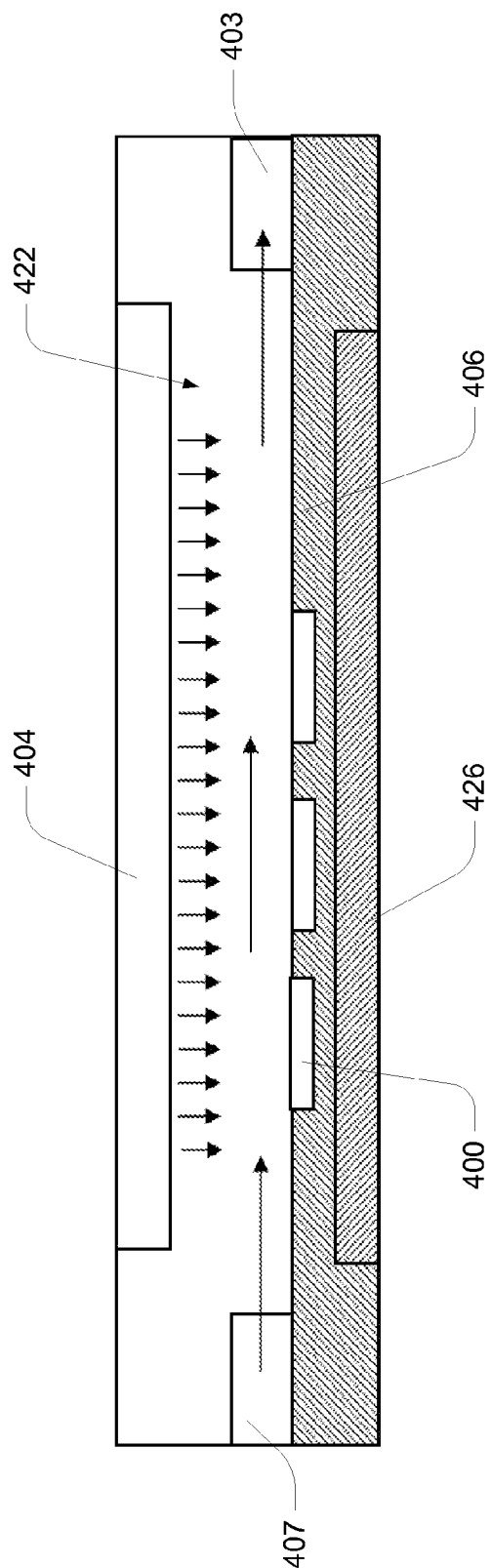
FIG. 4 is a sectional side view of a rectangular CVD reactor chamber.
Figure 5:
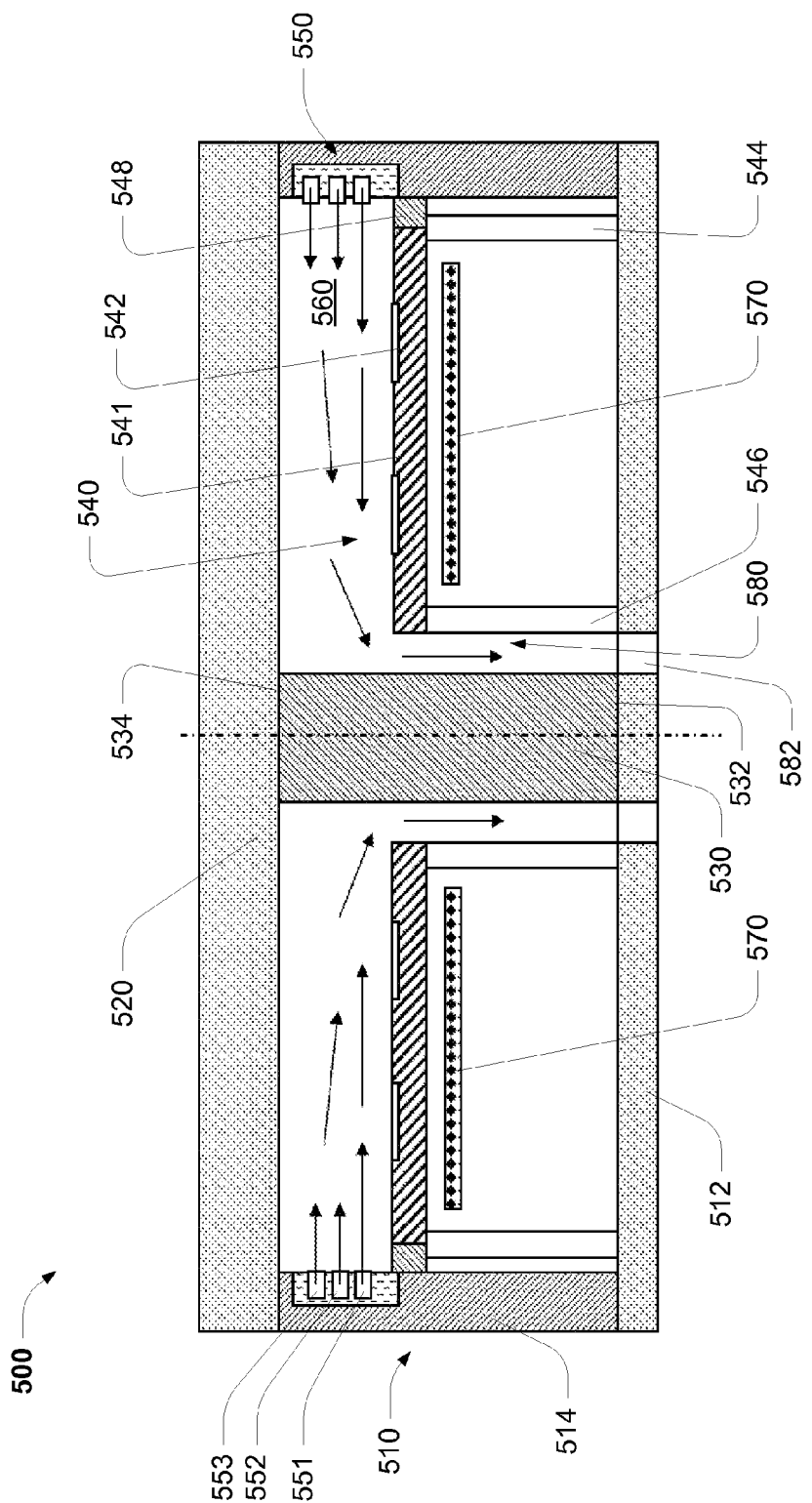
FIG. 5 is a sectional side view of an embodiment reactor chamber, wherein a gas inlet ring is horizontally disposed in the periphery of chamber.

Referring to FIG. 5, it will be appreciated that an embodiment reactor apparatus 500 for chemical vapor deposition, comprises:

a reactor body 510 defining a reaction chamber 560;
a close element 520 for operatively (or substantially) sealing the reaction chamber;
a support element 530 located within the reaction chamber for supporting the close element, the support element being supportedly coupled to the reactor body at 532.

In this embodiment, the reactor body 510 includes a bottom plate 512 and a peripheral (typically cylindrical) side wall 514. The reactor body defining a substantially cylindrical reaction chamber 560. The support element is substantially centrally-axially located within the reaction chamber, and the close element is substantially circular. The support element is substantially concentrically coupled to the bottom plate at 532, and the support element defines an abutment surface 534 for abutting support of the close element 520.

The apparatus 500 further comprises a wafer carrier 540 being substantially horizontally disposed within the reaction chamber 560 for providing a substantially horizontally wafer reaction surface 541. The wafer carrier is an annular wafer carrier concentrically located and vertically supported within the chamber by an outer support tube 544 and an inner support tube 546. The annular wafer carrier substantially encircles the support element. The inner support tube is an circumferential inner wall encircling and displaced from the support element 530 for defining a gas discharge passage 580 therebetween.

The apparatus 500 further comprises a gas inlet ring 550 located about the periphery of the chamber 560. The gas inlet ring includes a plurality of vertically-spaced annular gas injectors (551, 552 and 553), each annular gas injector being typically connected to a separate gas supply manifold.

The apparatus 500 further comprises a gas egress passage 580 proximal the support element 530. The gas egress passage can include passage though a gas discharge ring (not shown) that is horizontally disposed about the support element.

According to one embodiment, as shown in FIG. 5, a CVD reactor 500 can have a generally cylindrical chamber 560. A generally cylindrical chamber 560 comprises a generally circular top plate, so as to be the lid 520, a cylindrical lid support 530, an annular wafer carrier 540, support tubes 544 and 546, a gas inlet ring 550, an annular gas discharge passage 580, a heat assembly 570, and an exhaust port 582. The cylindrical lid support 530 is preferred to be concentrically disposed in the center of a bottom plate 512 and provides an upper ridge whereon the central portion of the lid of the chamber rests.

The annular wafer carrier 540 is preferred to be horizontally disposed on the support tubes 544 and 546. The annular wafer carrier 540 comprises a plurality of pockets, each of which is configured to contain a wafer 542.

The gas inlet ring 550 is preferred to be horizontally disposed in the periphery of the chamber 560 and preferably comprises a plurality of annular injectors i.e. 551, 552 and 553 vertically one above the other. Each annular injector is connected to a separate gas supply manifold.

The annular gas discharge passage 580 surrounds the cylindrical lid support 530. Preferably, a gas discharge ring (not shown) is horizontally disposed in the annular gas discharge passage 580 about the cylindrical lid support 530 to retain a laminar flowing state of the gases before entering the exhaust port 582.

Preferably, the down surface of the lid 520 can be protected by attaching another sheet of plate (not shown) from direct deposition of the reactants during CVD processes.

A method depositing crystalline layers on crystalline substrates using the CVD reactor chamber as shown in FIG. 5 of one embodiment of this invention is set forth in the description which follows. One stream of gases mainly including the Group V reactant gases, i.e. $NH_3$, another stream of gases mainly comprising the Group III reactant gases, i.e. TMGa, TMAl and TMIn, and another yet stream of gases mainly consisting of Ar, $H_2$, $N_2$ or Group V reactant gases or their mixtures are horizontally injected respectively through the annular injectors 551, 552 and 553 into the cylindrical chamber 560 in the inwardly radial direction. As shown in FIG. 5, a laminar flowing state can be retained in the entire chamber 560 until all the gases are evacuated in the annular gas discharge passage 580. The depletion effect particularly related to the Group III reactants is inherently compensated by the converging gas flow in the inwardly radial direction. Uniform layers can be deposited without rotation of the wafers 542, thus simplifying construction and reducing costs particularly related to the annular wafer carrier 540. Referring to FIG. 5, the gas inlet ring 550 is horizontally disposed in the periphery of the chamber 560, thus further simplifying construction, reducing costs, and easing routine operation particularly related to the lid 520. A complete cleaning of the down surface of the lid 520 can be done routinely to ensure repeatability and reproducibility of CVD processes. The cylindrical lid support 530 mitigates deformation of the lid 520, facilitating easy and economic scale-up of the cylindrical chamber size in diameter for a larger wafer capacity.

It will be appreciated that a CVD reactor having a cylindrical chamber for deposition of crystalline layers on one or more likewise crystalline substrates. The chamber comprises a cylindrical lid support and an annular gas distribution plate, which mitigates complexities and costs of building a large size chamber, and said chamber can be configured to have a horizontal laminar flow of at least one stream in the radial direction and a vertical downward flow of another gas stream over wafers to provide repeatability, reproducibility and consistency of chemical vapor deposition processes and to achieve uniformity of deposited layers at reduced consumption of reactants.

Figure 6:
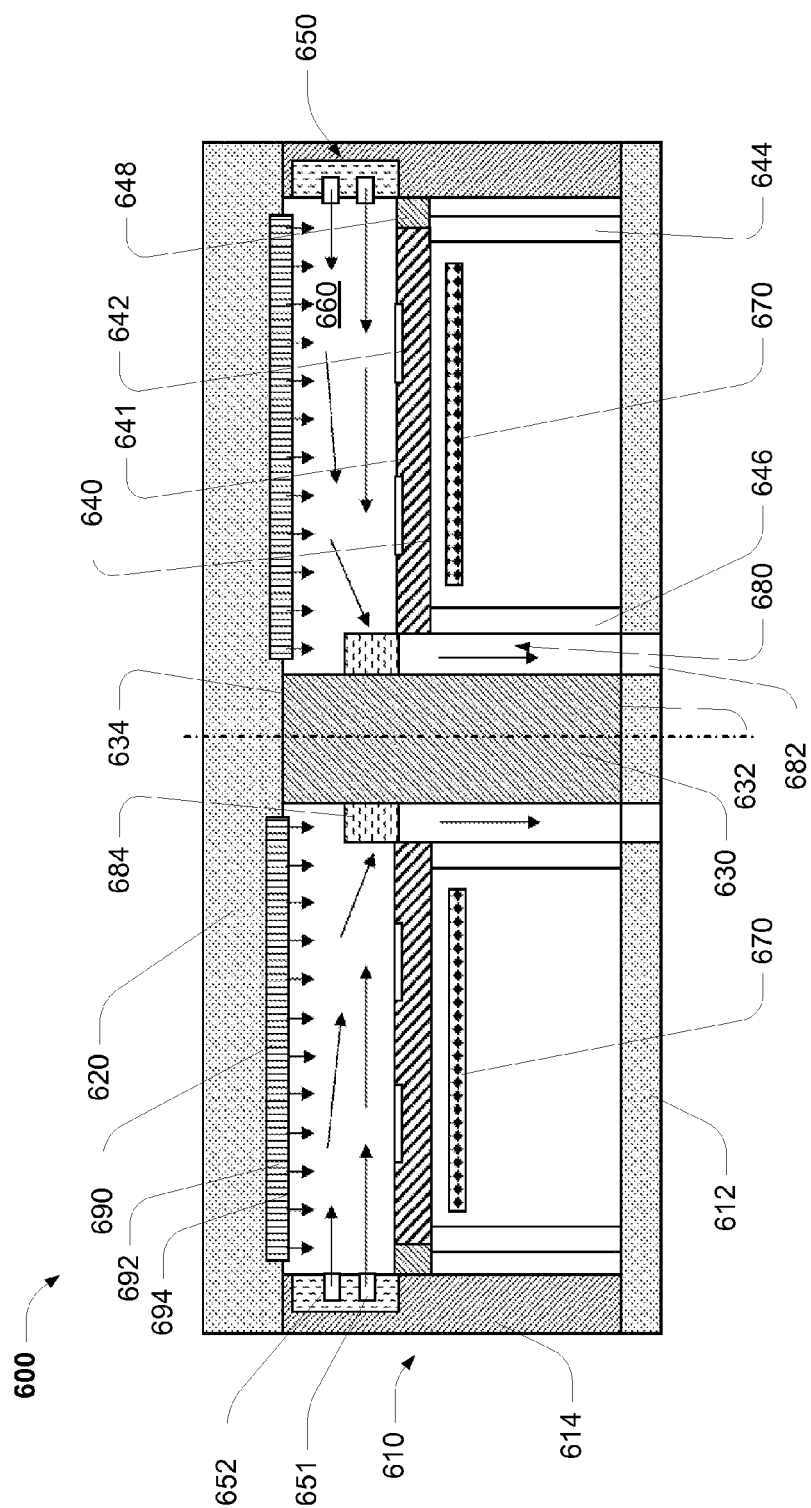
FIG. 6 is a sectional side view of an embodiment reactor chamber, wherein a gas inlet ring is horizontally disposed in the periphery of chamber and a gas injection plate is at the top of the chamber.

According to another embodiment, as shown in FIG. 6, a CVD reactor 600 can have a generally cylindrical chamber 660. A generally cylindrical chamber 660 comprises a generally circular top plate, so as to be the lid 620, a cylindrical lid support 630, a gas injection plate 690, an annular wafer carrier 640, support tubes 644 and 646, a gas inlet ring 650, an annular gas discharge ring 684, a heat assembly 670, and an exhaust port 682.

The cylindrical lid support 630 is preferred to be concentrically disposed in the center of a bottom plate 612 and provides an upper ridge whereon the central portion of the lid of the chamber rests.

The gas injection plate 690 at the top of the chamber 660 comprises a plurality of openings 692 regularly distributed in the down surface thereof, which can provide a vertical gas flow downwardly to the surface of the annular wafer carrier 640. It is further preferred that the radial width of the annular zone having the openings 692 on the down surface 694 is broader than the radial width of the annular area where the wafers 642 are placed.

The annular wafer carrier 640 is preferred to be horizontally disposed on the support tubes 644 and 646. The annular wafer carrier 640 comprises a plurality of pockets, each of which is configured to contain a wafer 642.

The gas inlet ring 650 is preferred to be horizontally disposed in the periphery of the chamber 660 and preferably comprises a plurality of annular injectors i.e. 651 and 652 vertically one above the other. Each annular injector is connected to a separate gas supply manifold.

The annular gas discharge ring 684 is horizontally disposed in the cylindrical lid support 630 to retain a laminar flowing state of gases before entering the exhaust port 682. For simplicity, the annular gas discharge ring 684 can be replaced by the annular gas discharge passage 680 surrounding the cylindrical lid support 630.

A method depositing crystalline layers on crystalline substrates using the CVD reactor chamber as shown in FIG. 6 of another embodiment of this invention is set forth in the description which follows. One stream of gases mainly including the Group V reactant gases, i.e. $NH_3$, and another stream of gases mainly comprising the Group III reactant gases, i.e. TMGa, TMAl and TMIn, are horizontally injected respectively through the annular injectors 651 and 652 into the cylindrical chamber 660 in the inwardly radial direction. Another yet stream of gases mainly consisting of Ar, $H_2$, $N_2$ or Group V reactant gases or Group III reactant gases or their mixtures is injected through the openings 692 of the gas injection plate 690 into the chamber 660 in the vertical direction.

As shown in FIG. 6, the vertical gas flow is intended to cross substantially perpendicularly to the horizontal gas flow, so as to prevent the horizontal gases from upwardly penetrating. A laminar flowing state can be retained in the entire chamber 660 until all the gases are evacuated through the annular gas discharge ring 684. The depletion effect particularly related to the Group III reactants is inherently compensated by the converging gas flow in the inwardly radial direction. Uniform layers can be deposited without rotation of the wafers 642, thus simplifying construction and reducing costs particularly related to the annular wafer carrier 640. The cylindrical lid support 630 mitigates deformation of the lid 620, facilitating easy and economic scale-up of the cylindrical chamber size for a larger wafer capacity.

A method depositing crystalline layers on crystalline substrates using the CVD reactor chamber as shown in FIG. 6 of another yet embodiment of this invention is set forth in the description which follows. One stream of gases mainly including the Group V reactant gases, i.e. $NH_3$, is horizontally injected through the annular injector 650a into the cylindrical chamber 660 in the inwardly radial direction. Another stream of gases mainly comprising the Group III reactant gases, i.e. TMGa, TMAl and TMIn, is injected through the openings 692 of the gas injection plate 690 into the chamber 660 in the vertical direction.

The uniform distribution of the Group III reactants over the entire wafer carrier 640 can produce uniform deposition of layers on the wafers 642. So, the wafers 642 are not necessary to be rotated, thus simplifying construction and reducing costs. The vertical gas flow can suppress thermal convection above heated wafers 642 to retain a laminar flowing state of the gases horizontally inwardly injected by the gas inlet ring 650 to the annular gas discharge ring 684. The Group V and Group III reactant gases are completely separated before entering the chamber 660. They are mixed immediately before reaching the surface of the wafers 642, hence parasitic reactions only happen in a very short time, which substantially reduces the formation of particles and adducts in the gas phase. The cylindrical lid support 630 mitigates deformation of the lid 620, facilitating easy and economic scale-up of the cylindrical chamber size for a larger wafer capacity.

A method depositing crystalline layers on crystalline substrates using the CVD reactor chamber as shown in FIG. 6 of another embodiment of this invention is set forth in the description which follows. One stream of gases mainly including the Group III reactant gases, i.e. TMGa, TMAl and TMIn, is horizontally injected through the annular injector 652 into the cylindrical chamber 660 in the inwardly radial direction. Another stream of gases mainly comprising the Group V reactant gases, i.e. $NH_3$, is injected through the openings 692 of the gas injection plate 690 into the chamber 660 in the vertical direction. The depletion effect particularly related to the Group III reactants is inherently compensated by the converging gas flow in the inwardly radial direction. Uniform layers can be deposited without rotation of the wafers 642, thus simplifying construction and reducing costs particularly related to the annular wafer carrier 640. The vertical gas flow can suppress thermal convection above heated wafers 642 to retain a laminar flowing state of the gases horizontally inwardly injected by the gas inlet ring 650 to the annular gas discharge ring 684. The Group V and Group III reactant gases are completely separated before entering the chamber 660. They are mixed immediately before reaching the surface of the wafers 642, hence parasitic reactions only happen in a very short time, which substantially reduces the formation of particles and adducts in the gas phase. The cylindrical lid support 630 mitigates deformation of the lid 620, facilitating easy and economic scale-up of the cylindrical chamber size for a larger wafer capacity.

Figure 7:
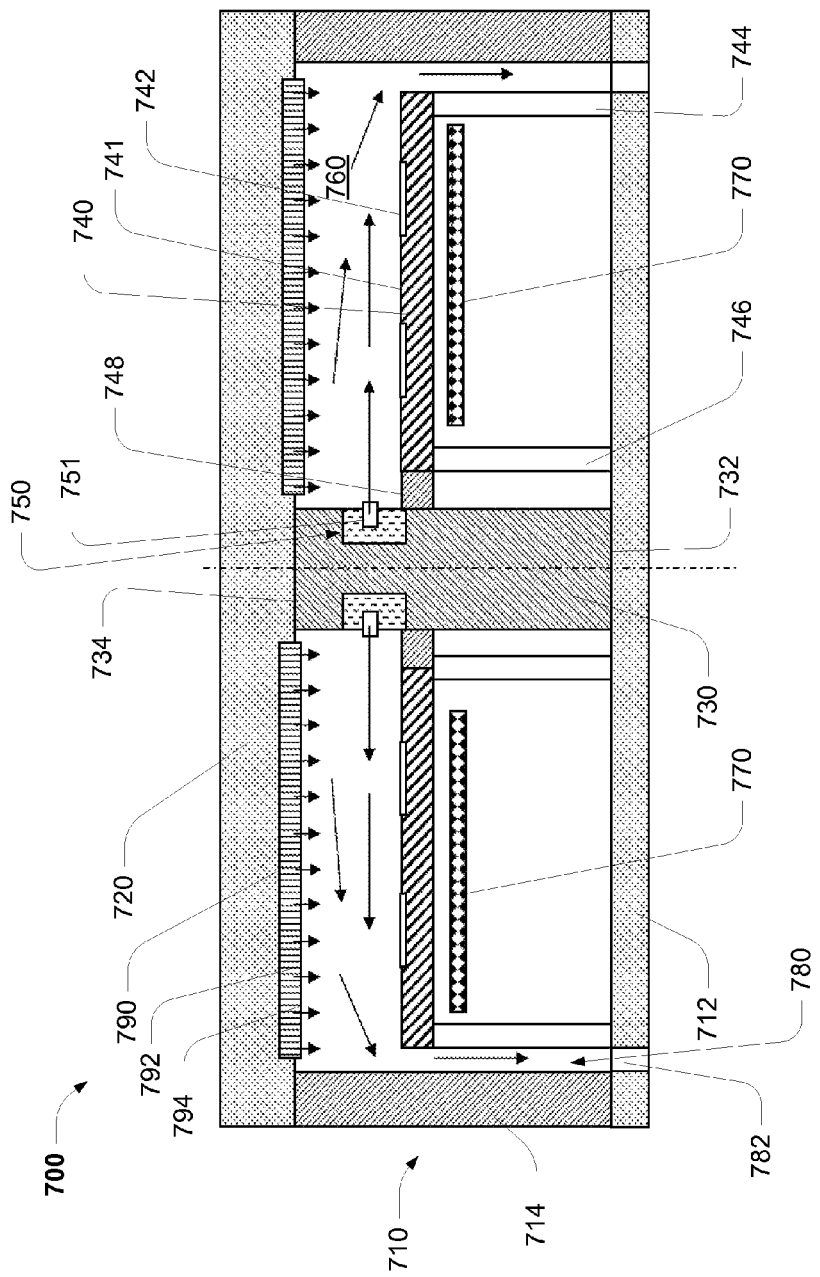
FIG. 7 is a sectional side view of an embodiment reactor chamber, wherein a gas inlet ring is horizontally disposed in cylindrical lid support and a gas injection plate is at the top of the chamber.

According to another yet embodiment, as shown in FIG. 7, a CVD reactor 700 can have a generally cylindrical chamber 760. A generally cylindrical chamber 760 comprises a generally circular top plate, so as to be the lid 720, a cylindrical lid support 730, a gas injection plate 790, an annular wafer carrier 740, support tubes 744 and 746, a gas inlet ring 750, an annular gas discharge passage 780, a heat assembly 770, and an exhaust port 782.

The cylindrical lid support 730 is preferred to be concentrically disposed in the center of a bottom plate 713 and provides an upper ridge whereon the central portion of the lid of the chamber rests.

The gas injection plate 790 at the top of the chamber 760 comprises a plurality of openings 792 regularly distributed in the down surface thereof, which can provide a vertical gas flow downwardly to the surface of the annular wafer carrier 740. It is further preferred that the radial width of the annular zone having the openings 792 on the down surface 794 is broader than the radial width of the annular area where the wafers 742 are placed.

The annular wafer carrier 740 is preferred to be horizontally disposed on the support tubes 744 and 746. The annular wafer carrier 740 comprises a plurality of pockets, each of which is configured to contain a wafer 742.

The gas inlet ring 750 is preferred to be horizontally disposed in the cylindrical lid support 730 and preferably comprises a plurality of annular injectors i.e. 751 vertically one above the other. Each annular injector is connected to a separate gas supply manifold.

The annular gas discharge passage 780 in the periphery of the chamber 760 surrounds the outer wall of the wafer carrier 740.

A method depositing crystalline layers on crystalline substrates using the CVD reactor chamber as shown in FIG. 7 of one embodiment of this invention is set forth in the description which follows. One stream of gases mainly including the Group V reactant gases, i.e. $NH_3$, is horizontally injected through the annular injector 751 into the cylindrical chamber 760 in the outwardly radial direction. Another stream of gases mainly comprising the Group III reactant gases, i.e. TMGa, TMAl and TMIn, is injected through the openings 792 of the gas injection plate 790 into the chamber 760 in the vertical direction.

The uniform distribution of the Group III reactants over the entire wafer carrier 740 can produce uniform deposition of layers on the wafers 742. So, the wafers are not necessary to be rotated, thus simplifying construction and reducing costs. The vertical gas flow can suppress thermal convection above heated wafers 742 to retain a laminar flowing state of the gases horizontally outwardly injected by the gas inlet ring 750 to the annular gas discharge passage 780. The Group V and Group III reactant gases are mixed immediately in close proximity to the up surface of annular wafer carrier 740, hence parasitic reactions only happen in a very short time, which substantially reduces the formation of particles and adducts in the gas phase. The cylindrical lid support 730 mitigates deformation of the lid 720, facilitating easy and economic scale-up of the cylindrical chamber size for a larger wafer capacity.

Figure 8:
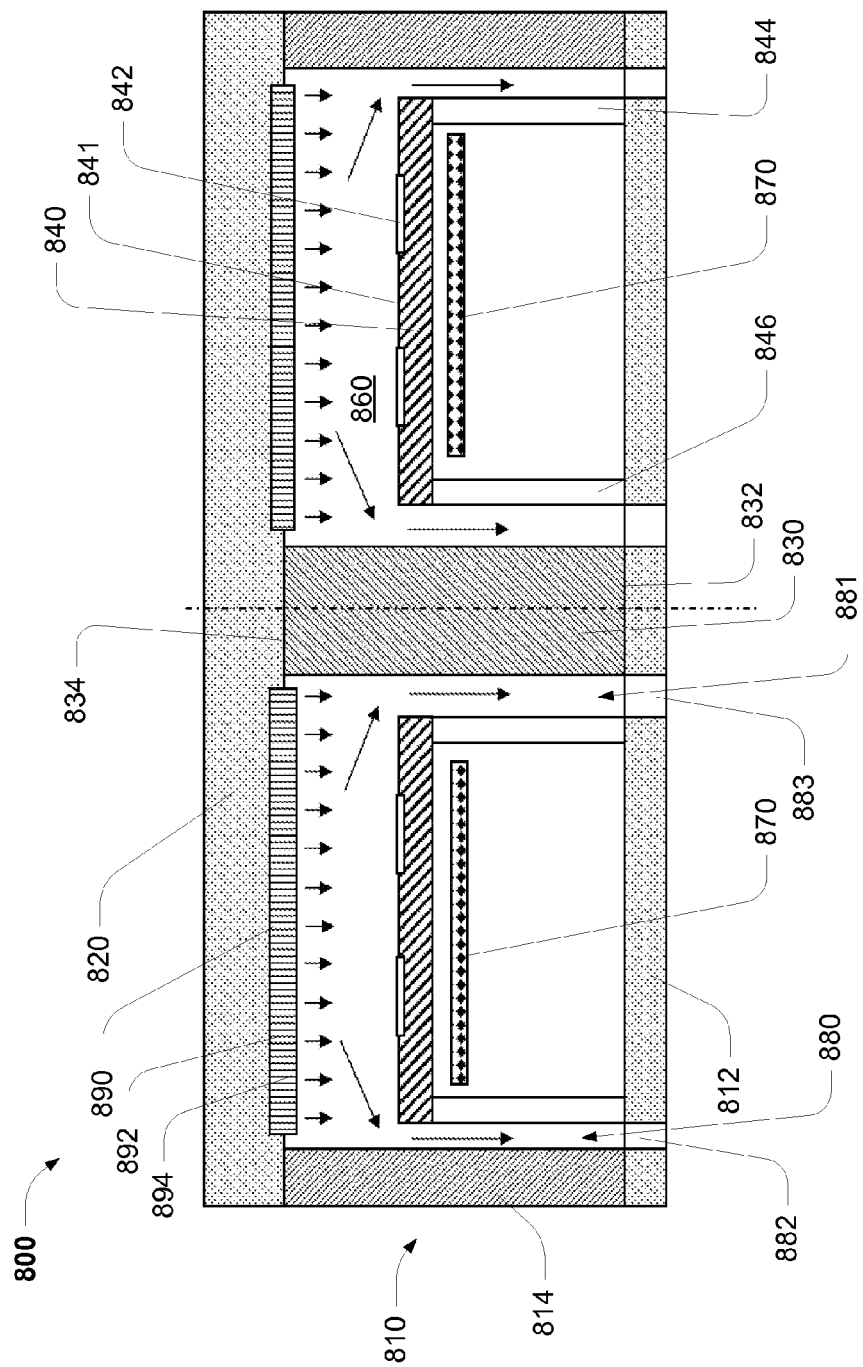
FIG. 8 is a sectional side view of an embodiment reactor chamber, wherein a gas injection plate is at the top of the chamber.

According to another yet embodiment, as shown in FIG. 8, a CVD reactor 800 can have a generally cylindrical chamber 860. A generally cylindrical chamber 860 comprises a generally circular top plate, so as to be the lid 820, a cylindrical lid support 830, a gas injection plate 890, an annular wafer carrier 840, support tubes 844 and 846, an inner and outer annular gas discharge passage 881 and 880, a heat assembly 870, and an exhaust port 882,883.

The cylindrical lid support 830 is preferred to be concentrically disposed in the center of a bottom plate 812 and provides an upper ridge whereon the central portion of the lid of the chamber rests.

The gas injection plate 890 at the top of the chamber 860 comprises two separate sets of a plurality of openings 892 regularly distributed in the down surface thereof, which can provide vertical gas flows downwardly to the surface of the annular wafer carrier 840. Each set of the openings 892 is connected to a separate gas supply manifold. It is further preferred that the radial width of the annular zone having the openings 892 on the down surface 894 is broader than the radial width of the annular area where the wafers 842 are placed.

The annular wafer carrier 840 is preferred to be horizontally disposed on the support tubes 844 and 846. The annular wafer carrier 840 comprises a plurality of pockets, each of which is configured to contain a wafer 842.

The inner annular gas discharge passage 881 surrounds the inner wall of the wafer carrier 840 and the outer annular gas discharge passage 880 surrounds the outer wall of the wafer carrier 840.

A method depositing crystalline layers on crystalline substrates using the CVD reactor chamber as shown in FIG. 8 of one embodiment of this invention is set forth in the description which follows. One stream of gases mainly including the Group V reactant gases, i.e. $NH_3$, and the other stream of gases mainly comprising the Group III reactant gases, i.e. TMGa, TMAl and TMIn, is separately injected through the corresponding set of the openings 892 in the gas injection plate 890 into the chamber 860 in the vertical direction.

The uniform distribution of the Group III reactants over the entire wafer carrier 840 can produce uniform deposition of layers on the wafers 842. So, the wafers 842 are not necessary to be rotated, thus simplifying construction and reducing costs. The vertical gas flow can suppress thermal convection above heated wafers 842 to retain a spreading laminar flowing state of the gases in the chamber 860. The cylindrical lid support 830 mitigates deformation of the lid 820, facilitating easy and economic scale-up of the cylindrical chamber size for a larger wafer capacity.

Figure 9:
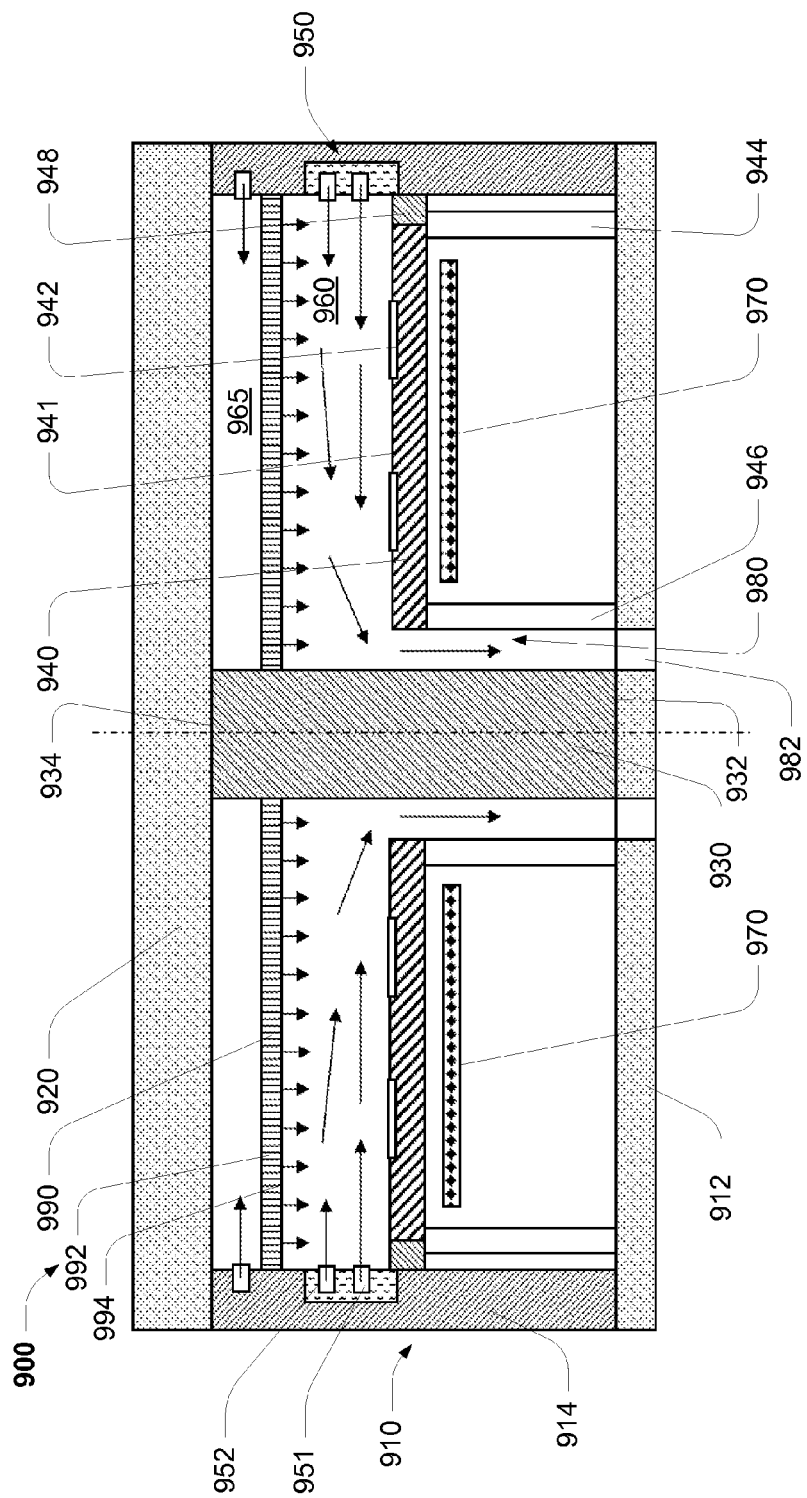
FIG. 9 is a sectional side view of an embodiment reactor chamber, wherein a gas inlet ring is horizontally disposed in the periphery of the chamber and a gas distribution plate is horizontally disposed in the chamber.

According to another yet embodiment, as shown in FIG. 9, a CVD reactor 900 can have a generally cylindrical chamber 960. A generally cylindrical chamber 960 comprises a generally circular top plate, so as to be the lid 920, a cylindrical lid support 930, an annular gas distribution plate 990, a gas injection ring 955, an annular wafer carrier 940, support tubes 944 and 946, a gas inlet ring 950, an annular gas discharge passage 980, a heat assembly 970, and an exhaust port 982.

The cylindrical lid support 930 is preferred to be concentrically disposed in the center of a bottom plate 913 and provides an upper ridge whereon the central portion of the lid of the chamber rests.

The annular gas distribution plate 990 having a plurality of through openings 992 arranged throughout the down surface thereof is horizontally disposed immediately below the lid of the chamber, so as to define an upper compartment 965. It is further preferred that the radial width of the annular zone having the openings 992 on the down surface 994 is broader than the radial width of the annular area where the wafers 942 are placed. The distance between the up surface of the annular gas distribution plate 990 and the down surface of the lid 920 is small enough to create a generally laminar flow of gases through the upper compartment 965.

The annular wafer carrier 940 is preferred to be horizontally disposed on the support tubes 944 and 946. The annular wafer carrier 940 comprises a plurality of pockets, each of which is configured to contain a wafer 942.

The gas injection ring 955 is horizontally disposed in the periphery of the chamber 960 vertically between the lid of the chamber and the up surface of the gas distribution plate 990.

The gas inlet ring 950 is preferred to be horizontally disposed in the periphery of the chamber 960 vertically between the down surface of the gas distribution plate 990 and the up surface of the wafer carrier 940 and preferably comprises a plurality of annular injectors i.e. 951 and 952 vertically one above the other. Each annular injector is connected to a separate gas supply manifold.

The annular gas passage 980 surrounds the cylindrical lid support 930. It is preferable to have a gas discharge ring (not shown) horizontally disposed in the cylindrical lid support 930;

A method depositing crystalline layers on crystalline substrates using the CVD reactor chamber as shown in FIG. 9 of one embodiment of this invention is set forth in the description which follows. One stream of gases mainly including the Group V reactant gases, i.e. $NH_3$, the other stream of gases mainly comprising the Group III reactant gases, i.e. TMGa, TMAl and TMIn, are horizontally injected respectively through the annular injector 951 and 952 into the cylindrical chamber 960 in the inwardly radial direction. Another stream of gases mainly consisting of Ar, $H_2$, $N_2$ or Group V reactant gases or Group III reactant gases or their mixtures, which are horizontally injected by the gas injection ring 955 into the upper compartment 965 in the inwardly radial direction, passing through the openings 992 are vertically straightened and therefore uniformly distribute downwardly over the surface of an entire wafer carrier 940.

The different densities and the great differences in the flow velocities of the gases horizontally entering the cylindrical chamber 960 produce an annular vortex underneath the down surface of the annular gas distribution plate 990. A stream of gases vertically flowing downward through the openings 992 of the annular gas distribution plate 990 can prevent this vortex. As shown in FIG. 9, a laminar flowing state can be retained in the entire chamber 960 until all the gases are evacuated through the annular gas discharge passage 980. The depletion effect particularly related to the Group III reactants is inherently compensated by the converging gas flow in the inwardly radial direction. Uniform layers can be deposited without rotation of the wafers 942, thus simplifying construction and reducing costs particularly related to the annular wafer carrier 940. The cylindrical lid support 930 mitigates deformation of the lid 920, facilitating easy and economic scale-up of the cylindrical chamber size for a larger wafer capacity.

A method depositing crystalline layers on crystalline substrates using the CVD reactor chamber as shown in FIG. 9 of another embodiment of this invention is set forth in the description which follows. One stream of gases mainly including the Group V reactant gases, i.e. $NH_3$, is horizontally injected through the annular injector 951 into the cylindrical chamber 960 in the inwardly radial direction. Another stream of gases mainly comprising the Group III reactant gases, i.e. TMGa, TMAl and TMIn, which are horizontally injected by the gas injection ring 955 into the upper compartment 965 in the inwardly radial direction, passing through the openings 992 are vertically straightened and therefore uniformly distribute downwardly over the surface of an entire wafer carrier 940.

The uniform distribution of the Group III reactants over the entire wafer carrier 940 can produce uniform deposition of layers on the wafers 942. So, the wafers 942 are not necessary to be rotated, thus simplifying construction and reducing costs. The vertical gas flow can suppress thermal convection above heated wafers 942 to retain a laminar flowing state of the gases horizontally inwardly injected by the gas inlet ring 950 to the annular gas discharge passage 980. The Group V and Group III reactant gases are mixed immediately before reaching the surface of the wafers 942, hence parasitic reactions only happen in a very short time, which substantially reduces the formation of particles and adducts in the gas phase. The cylindrical lid support 930 mitigates deformation of the lid 920, facilitating easy and economic scale-up of the cylindrical chamber size for a larger wafer capacity.

A method depositing crystalline layers on crystalline substrates using the CVD reactor chamber as shown in FIG. 9 of another yet embodiment of this invention is set forth in the description which follows. One stream of gases mainly including the Group III reactant gases, i.e. TMGa, TMAl and TMIn, is horizontally injected through the annular injector 952 into the cylindrical chamber 960 in the inwardly radial direction. Another stream of gases mainly comprising the Group V reactant gases, i.e. $NH_3$, which are horizontally injected by the gas injection ring 955 into the upper compartment 965 in the inwardly radial direction, passing through the openings 992 are vertically straightened and therefore uniformly distribute downwardly over the surface of an entire wafer carrier 940.

The depletion effect particularly related to the Group III reactants is inherently compensated by the converging gas flow in the inwardly radial direction. Uniform layers can be deposited without rotation of the wafers 942, thus simplifying construction and reducing costs particularly related to the annular wafer carrier 940. The vertical gas flow can suppress thermal convection above heated wafers 942 to retain a laminar flowing state of the gases horizontally inwardly injected by the gas inlet ring 950 to the annular gas discharge passage 980. The Group V and Group III reactant gases are mixed immediately before reaching the surface of the wafers 942, hence parasitic reactions only happen in a very short time, which substantially reduces the formation of particles and adducts in the gas phase. The cylindrical lid support 930 mitigates deformation of the lid 920, facilitating easy and economic scale-up of the cylindrical chamber size for a larger wafer capacity.

It is also preferable to have the gas injection ring 955 horizontally disposed in the cylindrical lid support 930 vertically between the lid of the chamber and the up surface of the gas distribution plate 990. In this case, the stream of the gases, which are horizontally injected by the gas injection ring 955 into the upper compartment 965 in the outwardly radial direction, passing through the openings 992 are vertically straightened and therefore uniformly distribute downwardly over the surface of an entire wafer carrier 940.

Figure 10:
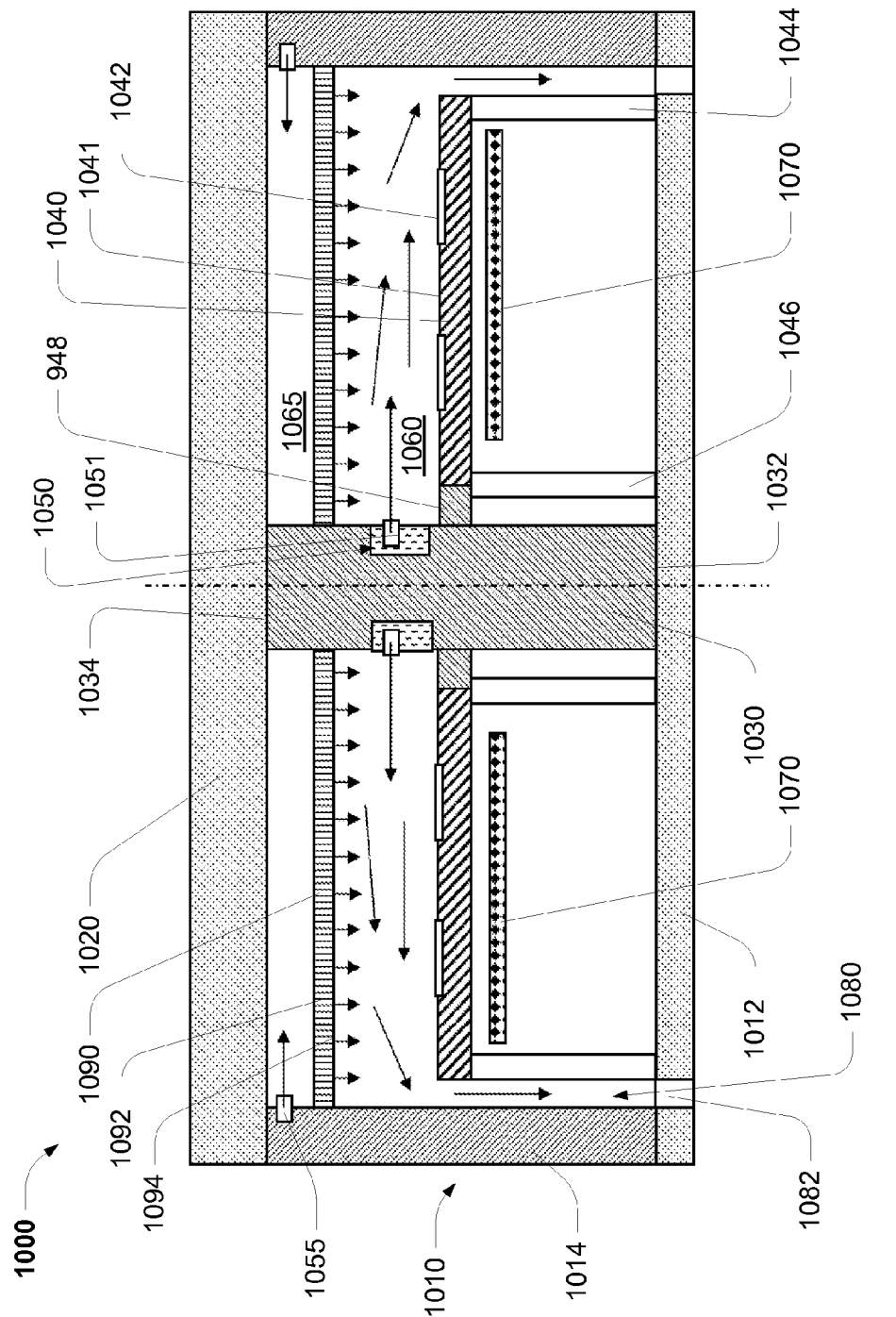
FIG. 10 is a sectional side view of an embodiment reactor chamber, wherein a gas inlet ring is horizontally disposed in cylindrical lid support and a gas distribution plate is horizontally disposed in chamber.

According to one embodiment, as shown in FIG. 10, a CVD reactor 1000 can have a generally cylindrical chamber 1060. A generally cylindrical chamber 1060 comprises a generally circular top plate, so as to be the lid 1020, a cylindrical lid support 1030, an annular gas distribution plate 1090, a gas injection ring 1055, an annular wafer carrier 1040, support tubes 1044 and 1046, a gas inlet ring 1050, an annular gas discharge passage 1080, a heat assembly 1070, and an exhaust port 1082.

The cylindrical lid support 1030 is preferred to be concentrically disposed in the center of a bottom plate 1013 and provides an upper ridge whereon the central portion of the lid of the chamber rests.

The annular gas distribution plate 1090 having a plurality of through openings 1092 arranged throughout the down surface thereof is horizontally disposed immediately below the lid of the chamber, so as to define an upper compartment 1065. It is further preferred that the radial width of the annular zone having the openings 1092 on the down surface 1094 is broader than the radial width of the annular area where the wafers 1042 are placed. The distance between the up surface of the annular gas distribution plate 1090 and the down surface of the lid 1020 is small enough to create a generally laminar flow of gases through the upper compartment 1065.

The annular wafer carrier 1040 is preferred to be horizontally disposed on the support tubes 1044 and 1046. The annular wafer carrier 1040 comprises a plurality of pockets, each of which is configured to contain a wafer 1042.

The gas injection ring 1055 is horizontally disposed in the periphery of the chamber 1060 vertically between the lid of the chamber and the up surface of the gas distribution plate 1090.

The gas inlet ring 1050 is preferred to be horizontally disposed in the cylindrical lid support 1030 vertically between the down surface of the gas distribution plate 1090 and the up surface of the wafer carrier 1040 and preferably comprises a plurality of annular injectors i.e. 1051 vertically one above the other. Each annular injector is connected to a separate gas supply manifold.

The annular gas passage 1080 surrounds the outer wall of the annular wafer carrier 1040 in the periphery of the chamber 1060. It is preferable to have a gas discharge ring 1003 (not shown) horizontally disposed in the side wall 1014 of the chamber 1060.

A method depositing crystalline layers on crystalline substrates using the CVD reactor chamber as shown in FIG. 10 of one embodiment of this invention is set forth in the description which follows. One stream of gases mainly including the Group V reactant gases, i.e. $NH_3$, is horizontally injected through the annular injector 1051 into the cylindrical chamber 1060 in the outwardly radial direction. Another stream of gases mainly comprising the Group III reactant gases, i.e. TMGa, TMAl and TMIn, which are horizontally injected by the gas injection ring 1055 into the upper compartment 1065 in the inwardly radial direction, passing through the openings 1092 are vertically straightened and therefore uniformly distribute downwardly over the surface of an entire wafer carrier 1040.

The uniform distribution of the Group III reactants over the entire wafer carrier 1040 can produce uniform deposition of layers on the wafers 1042. So, the wafers 1042 are not necessary to be rotated, thus simplifying construction and reducing costs. The vertical gas flow can suppress thermal convection above heated wafers 1042 to retain a laminar flowing state of the gases horizontally outwardly injected by the gas inlet ring 1050 to the annular gas discharge passage 1080. The Group V and Group III reactant gases are mixed immediately before reaching the surface of the wafers 1042, hence parasitic reactions only happen in a very short time, which substantially reduces the formation of particles and adducts in the gas phase. The cylindrical lid support 1030 mitigates deformation of the lid 1020, facilitating easy and economic scale-up of the cylindrical chamber size for a larger wafer capacity.

It is also preferable to have the gas injection ring 1055 horizontally disposed in the cylindrical lid support 1030 vertically between the lid of the chamber and the up surface of the gas distribution plate 1090. In this case, the stream of the gases, which are horizontally injected by the gas injection ring 1055 into the upper compartment 1065 in the outwardly radial direction, passing through the openings 1092 are vertically straightened and therefore uniformly distribute downwardly over the surface of an entire wafer carrier 1040.

The CVD chamber of this invention can provide a cylindrical lid support. Complexities and costs to building a large size chamber as well as difficulties and costs to maintain a large size chamber can be substantially mitigated. The CVD chamber of this invention can have a gas distribution plate, which can provide a vertical flow to retain a horizontal laminar flow of gases in the radial direction. The repeatability, reproducibility and consistency of chemical vapor deposition processes and uniformity of deposited layers at reduced consumption of reactants can be achieved.

It is understood that the exemplary method and apparatus for chemical vapor deposition described herein and shown in the drawings represents only presently preferred embodiments of the invention. Indeed, various modifications and additions may be made to such embodiments without departing from the spirit and scope of the invention. For example, it should be appreciated that the apparatus and method of the present invention may find applications which are different from chemical vapor deposition.

It will be appreciated that the illustrated apparatus can provide a useful alternative to known reactor apparatus.

Although the invention has been described with reference to specific examples, it will be appreciated by those skilled in the art that the invention may be embodied in many other forms.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

In the claims below and the description herein, any one of the terms comprising, comprised of or which comprises is an open term that means including at least the elements/features that follow, but not excluding others. Thus, the term comprising, when used in the claims, should not be interpreted as being limitative to the means or elements or steps listed thereafter. For example, the scope of the expression a device comprising A and B should not be limited to devices consisting only of elements A and B. Any one of the terms including or which includes or that includes as used herein is also an open term that also means including at least the elements/features that follow the term, but not excluding others. Thus, including is synonymous with and means comprising.

Similarly, it is to be noticed that the term coupled, when used in the claims, should not be interpreted as being limitative to direct connections only. The terms "coupled" and "connected", along with their derivatives, may be used. It should be understood that these terms are not intended as synonyms for each other. Thus, the scope of the expression a device A coupled to a device B should not be limited to devices or systems wherein an output of device A is directly connected to an input of device B. It means that there exists a path between an output of A and an input of B which may be a path including other devices or means. "Coupled" may mean that two or more elements are either in direct physical, or that two or more elements are not in direct contact with each other but yet still co-operate or interact with each other.

As used herein, unless otherwise specified the use of the ordinal adjectives "first", "second", "third", etc., to describe a common object, merely indicate that different instances of like objects are being referred to, and are not intended to imply that the objects so described must be in a given sequence, either temporally, spatially, in ranking, or in any other manner.

As used herein, unless otherwise specified the use of terms "horizontal", "vertical", "left", "right", "up" and "down", as well as adjectival and adverbial derivatives thereof (e.g., "horizontally", "rightwardly", "upwardly", etc.), simply refer to the orientation of the illustrated structure as the particular drawing figure faces the reader, or with reference to the orientation of the structure during nominal use, as appropriate. Similarly, the terms "inwardly" and "outwardly" generally refer to the orientation of a surface relative to its axis of elongation, or axis of rotation, as appropriate.

Similarly it should be appreciated that in the above description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the Detailed Description are hereby expressly incorporated into this Detailed Description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

In the description provided herein, numerous specific details are set forth. However, it is understood that embodiments of the invention may be practiced without these specific details. In other instances, well-known methods, structures and techniques have not been shown in detail in order not to obscure an understanding of this description.

Thus, while there has been described what are believed to be the preferred embodiments of the invention, those skilled in the art will recognize that other and further modifications may be made thereto without departing from the spirit of the invention, and it is intended to claim all such changes and modifications as fall within the scope of the invention. For example, any formulas given above are merely representative of procedures that may be used. Functionality may be added or deleted from the block diagrams and operations may be interchanged among functional blocks. Steps may be added or deleted to methods described within the scope of the present invention.

It will be appreciated that an embodiment of the invention can consist essentially of features disclosed herein. Alternatively, an embodiment of the invention can consist of features disclosed herein. The invention illustratively disclosed herein suitably may be practiced in the absence of any element which is not specifically disclosed herein.

What is claimed is:

1. A chemical vapor deposition reactor apparatus, the apparatus comprising:
    a reactor body having a peripheral side wall defining a reaction chamber;
    a close element for operatively sealing the reaction chamber, the close element having an outer perimeter directly supported by the side wall;
    a support element located within the reaction chamber, a portion of the support element being spaced apart from the side wall and being within the reaction chamber for supporting an inner region of the close element, the support element being supportedly coupled to the reactor body;
    a gas egress passage proximal the support element; and
    a gas ingress passage located about the periphery of the reaction chamber;
    a wafer carrier within the reaction chamber for carrying a substrate undergoing chemical vapor deposition.

2. The apparatus according to claim 1, wherein
    the reactor body has a bottom plate, and
    the support element being coupled to a portion of the bottom plate that is spaced apart from the side wall.

3. The apparatus according to claim 2, wherein
    the reactor body defines a substantially cylindrical reaction chamber; and
    the support element substantially centrally-axially located within the reaction chamber.

4. The apparatus according to claim 3, wherein:
    the close element is substantially circular.

5. The apparatus according to claim 1, wherein:
    the support element defines an abutment surface for abutting support of the close element.

6. The apparatus according to claim 1, wherein
    the wafer carrier is substantially horizontally disposed within the reaction chamber for providing a substantially horizontal wafer reaction surface.

7. The apparatus according to claim 6, wherein the wafer carrier is an annular wafer carrier concentrically located and vertically supported within the reaction chamber; the annular wafer carrier substantially encircling the support element.

8. The apparatus according to claim 6, wherein the reactor body has a bottom plate, wherein the support element extends between the bottom plate and the close element when in use, and wherein the wafer carrier has an circumferential inner wall encircling and displaced from the support element for defining a gas discharge passage therebetween.

9. The apparatus according to claim 1, wherein the gas ingress passage comprises a gas inlet ring located about the periphery of the reaction chamber.

10. The apparatus according to claim 9, wherein the gas inlet ring includes a plurality of vertically-spaced annular gas injectors, each annular gas injector is connected to a separate gas supply manifold.

11. The apparatus according to claim 9, wherein the gas egress passage is defined by a gas discharge ring horizontally disposed about the support element.

12. The apparatus according to claim 1, further comprising a gas injection plate located proximal to the top of the reaction chamber, wherein the gas injection plate has a plurality of regularly-distributed downwardly-directed gas apertures.

13. A method used to perform chemical vapor deposition, the method comprising the steps of:
   (a) presenting a reactor apparatus according to claim 1;
   (b) presenting a substrate on the wafer carrier within the reaction chamber;
   (c) injecting gas from the periphery of the reaction chamber in a substantially radial inward direction; and
   (d) evacuating exhaust gases proximal the support element, thereby to define a substantially-inwardly directed laminar flow of the gases over a surface of wafer carrier.

\* \* \* \* \*